Figure 1:
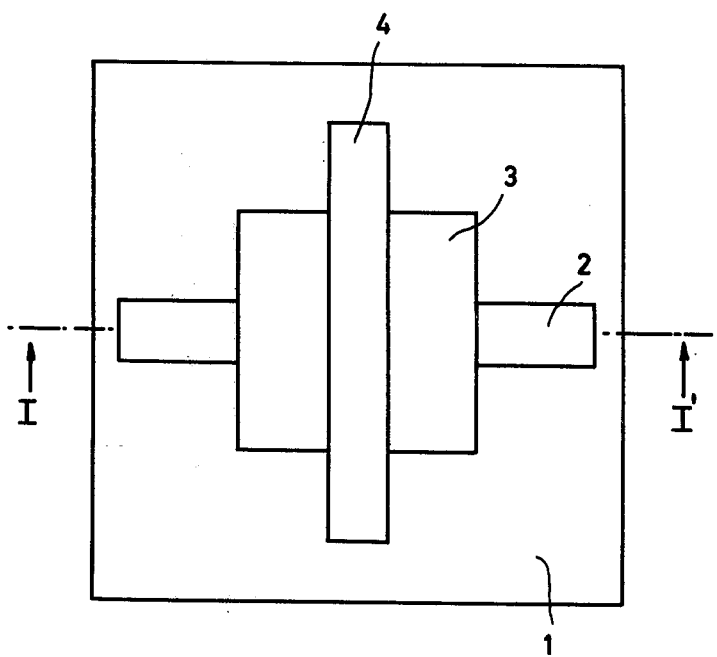

United States Patent [19]

Baudry et al.

[11] 4,152,282
[45] May 1, 1979

[54] SILK-SCREENING DIELECTRIC PASTE FOR MULTILAYER CIRCUIT FABRICATION COMPRISING ALUMINUM OXIDE AND A BOROSILICATE GLASS

[75] Inventors: Hugues Baudry, Villecresnes; Marc A. Monneraye, Saint-Maur, both of France

[73] Assignee: U.S. Philips Corporation, New York, N.Y.

[21] Appl. No.: 859,544

[22] Filed: Dec. 12, 1977

[30] Foreign Application Priority Data

Dec. 27, 1976 [FR] France .................. 76 39158

[51] Int. Cl.² .................. H01B 3/12; C03C 3/22
[52] U.S. Cl. .................. 252/63.2; 65/33; 106/39.6; 252/63.5
[58] Field of Search .................. 252/63.5, 63.2; 106/54, 106/39.6; 65/33

[56] References Cited

U.S. PATENT DOCUMENTS

| | | |
|---|---|---|
| 3,586,522 | 6/1971 | Hoffman .................. 65/33 X |
| 3,706,582 | 12/1972 | Meyer .................. 252/63.5 X |
| 3,707,499 | 12/1972 | Mason et al. .................. 252/63.5 |
| 3,778,242 | 12/1973 | Francel et al. .................. 106/39.6 X |
| 3,816,172 | 6/1974 | Hoffman .................. 252/63.2 X |

Primary Examiner—Harris A. Pitlick
Attorney, Agent, or Firm—Thomas A. Briody

[57] ABSTRACT

A dielectric composition which may be used as an insulating silk-screening paste and is compatible with a copper-containing conductive silk-screened layer, such as used in multilayer circuit boards. The paste includes an organic carrier, a mixture of aluminum oxide, and one or more types of glass of the "short" type, of which at least one glass can be devitrified by dissolution of the aluminum oxide.

2 Claims, 4 Drawing Figures

SILK-SCREENING DIELECTRIC PASTE FOR MULTILAYER CIRCUIT FABRICATION COMPRISING ALUMINUM OXIDE AND A BOROSILICATE GLASS

The invention relates to a dielectric composition which may be used in particular as an insulating silk-screening paste, in combination with a copper-containing conductive layer. The invention enables in particular the manufacture of multilayer structures consisting of layers having different electric properties, for example, an insulating layer on a conductive layer, or the so-called sandwich structure of an insulating layer between two conductive layers. According to recently developed manufacturing methods, thick layers, that is layers whose thickness is larger than 1 micron, are provided by means of silk-screening paste and numerous investigations lead to new compositions of the silk-screening paste.

U.K. Patent Application 76/11,412, and corresponding U.S. Patent Application Ser. No. 663,485 now abandoned, in the name of Applicant disclose a copper-containing conductive silk-screening paste which has to be fired in a nitrogen atmosphere so as to avoid annoying copper oxidation. Applicants found themselves faced with the problem to design an insulating silk-screening paste which can be provided on or between the copper-containing conductive silk-screened layers, so can be fired in a nitrogen atmosphere, but which can also be provided on other types of conductive layers. On the other hand, in the known manufacture of multilayer structures, a layer is generally deposited which is then fired, then a subsequent layer is deposited, and so on. It is necessary that, upon firing a layer, the previously deposited layers do not run. It is necessary, in particular when providing a conductive paste on an insulating layer, that the insulating layer can be heated at the firing temperature without undesired flow occurring. On the other hand it is necessary for the insulating layer to be sufficiently compact so as to provide a subsequent layer on it by silk-screening.

This problem has been solved by providing the insulating layer in the form of a spontaneously devitrifying glass which is dispersed in an organic carrier which is fired at a given temperature T at which the glass melts and then crystallises. A glass ceramic is obtained the melting temperature F of which is higher than T. Devitrifying glasses are known, for example from U.S. Pat. No. 3,586,522, in which a lead and barium silico aluminate is described the spontaneous devitrification of which can be catalysed by the addition of 3 to 15% titaniumdioxide.

When such a composition is used in insulating pastes which are suitable for the above-mentioned copper containing pastes, however, the following disadvantages occur.

The above-mentioned composition cannot be fired in a nitrogen atmosphere because it comprises reducible ions (lead, titanium), which by reduction on the one hand stimulate the diffusion of the copper in the insulating layer, which thus unfavorably influences the electrical properties of the said insulating layer, and on the other hand themselves involve unacceptable dielectric losses, for example by the simultaneous presence of ions of different valencies, for example $Ti^{3+}$ and $Ti^{4+}$ ions.

The dielectric constant $\epsilon$ is comparatively high ($\epsilon$ varies from 10 to 20), while layers are desired of which $\epsilon$ is near 6.

It is also known from U.K. Patent Specification No. 1,161,068 to mix a glass of the long type and having a high viscosity with a ceramic powder which restricts the flow thereof during the firing. This patent specification discloses a dielectric compound comprising a sodium silico-borate glass having a high silicon content, or a lead silicate glass of the long type mixed with a refractory ceramic powder, for example, $ZrO_2$, $TiO_2$ or $SiO_2$.

Upon firing such a composition the flow thereof is restricted by a mechanical effect as a result of the presence of the ceramic powder. The dielectric constant thereof is lower ($\epsilon$ near 8). However, such a composition cannot be used to prepare insulating pastes which are compatible with the above-mentioned known copper-containing pastes. They have the following disadvantages.

They contain reducible ions (titanium, lead) which by firing in nitrogen on the one hand contribute to the diffusion of copper in the said insulating layer and, on the other hand, due to reduction, increase the dielectric losses thereof.

The dielectric constant $\epsilon$ is better but the insulating layer softens during the firing afterwards. Because the vitreous state of the glasses used is very stable, they cannot devitrify under the influence of added ceramic phases.

Finally it is to be noted that a compromise has been surged between a none too high $\epsilon$ and a better mechanical stability of the dielectric layer during the thermal treatment by combining the two above ideas. For this purpose, British Patent Specification No. 1,349,671 describes a dielectric compound which contains 40 to 60% by weight of ceramic powder and 60 to 40% by weight of a barium- and lead borosilicate glass which has been made slightly devitrifiable by the addition of a small quantity of $TiO_2$. A preferred composition of the glass contains 37% $SiO_2$, 10% $B_2O_3$, 13% $Al_2O_3$, 15% PbO, 23% BaO and 2% $TiO_2$. As examples of ceramic powders are mentioned $ZrO_2$, $Al_2O_3$ and $TiO_2$ and a few silicates, the preferred material being zirconium ($ZrSiO_4$).

It is the object of the invention to mitigate the above-mentioned disadvantages by means of an insulating silk-screening paste compatible with the above-described copper-containing paste.

The dielectric composition according to the invention which consists of a mixture of a borosilicate glass and aluminum oxide is characterized in that the borosilicate glass which is present in a quantity between 70 and 40% by volume has a composition in mol.% between the following limits:

10–40 $SiO_2$
20–40 ZnO
15–35 $B_2O_3$
0–5 $Al_2O_3$
5–25 CaO and
0–15 SrO, and that the aluminum oxide is present in a quantity between 30 and 60% by volume.

Such a glass thus contains no oxides, for example lead or titanium oxides, which would be reduced as a result of heating in a nitrogen atmosphere.

According to a preferred embodiment the glass, in mol.%, consists of 40 $SiO_2$, 20 ZnO, 15 $B_2O_3$, 5 $Al_2O_3$, 5 CaO, 15 SrO.

In fact this glass has a high strain point which is approximately 590° C. and thus lies at an advantageous high level.

According to a modified embodiment of the invention the dielectric composition comprises a coloring oxide in a quantity which is smaller than 1 mol.%. Cobalt oxide in a quantity of 0.5 mol.% is preferably chosen as a coloring oxide.

Cobalt oxide is added as a dye so as to be able to easily trace visually the dielectric on the copper paste or the substrate prior to and after firing.

The invention also provides a silk-screening paste which contains the above-mentioned dielectric composition as a dispersion in an organic carrier. The invention also provides a silk-screened layer which is obtained by firing such a paste and an electric circuit element comprising a plurality of insulating and conductive layers, at least one of the said insulating layers being manufactured starting from the above-mentioned composition.

Figure 2:
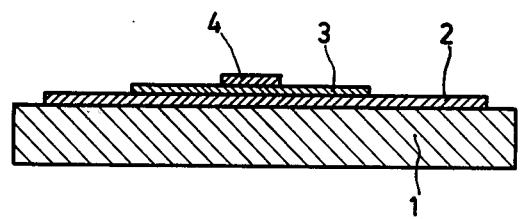

The invention will be described in greater detail with reference to the accompanying drawings, in which FIG. 1 is a plan view of a multilayer circuit according to the invention and FIG. 2 is a sectional view of the same circuit.

Figure 3:
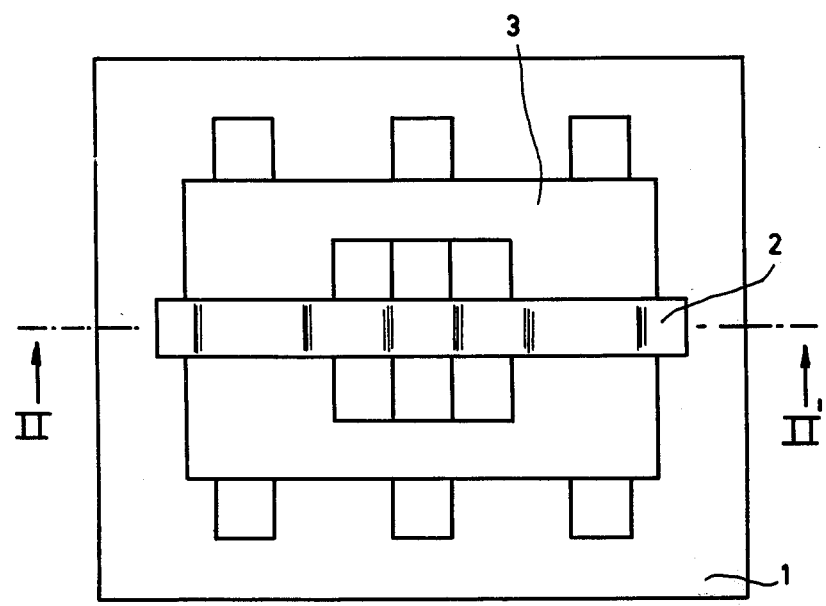
Figure 4:
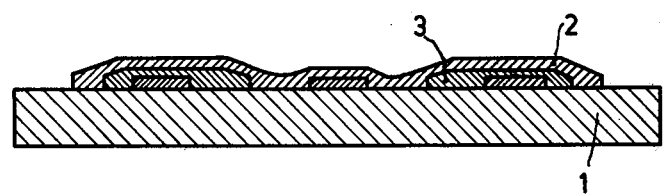

FIG. 3 is a plan view of a second multilayer circuit according to the invention and FIG. 4 is a sectional view of the same circuit.

FIG. 1 shows a substrate 1, for example an aluminium oxide substrate, on which a first conductive layer 2 is provided, for example by means of a copper-containing silk-screening paste according to Great Britain Patent Application No. 76/11,412, and U.S. Patent Application Ser. No. 663,485, a second insulating layer having a composition according to the invention, and a third conductive layer 4 the composition of which may be the same as that of layer 2.

FIG. 2 is a sectional view taken on the line I-I' of the embodiment shown in FIG. 1. The reference numerals are the same for the same elements in the two figures. According to an embodiment of the invention the aluminium oxide substrate was a square having sides of 2 cm and a thickness of 1 mm. The conductive layers 2 and 4 each have a thickness of 15 μm and the insulating layer has a thickness of 20 μm.

The insulating layer according to the invention is obtained by providing a silk-screening paste comprising mainly an organic binder having rheological properties which is suitable for silk-screening, and a mixture of a powder of aluminum oxide and at least one type of glass of the short type which can be devitrified by the chemical action of aluminium oxide.

During firing the insulating paste the aluminum oxide causes devitrification as a result of the dissolution of aluminum oxide in the initially vitreous phase or phases. A crystal phase or a mixture of crystal phases deposits which reinforces the structure of the dielectric layer by increasing the softening temperature. The quantity of aluminum oxide dissolved in the vitreous phase or phases becomes larger during the subsequent thermal treatments, so that the softening temperature keeps on rising further.

The kind of glass of the short type may be a mixture of kinds of glass of the short type, provided at least one of them can be devitrified by the aluminum oxide.

It is of course necessary for the glass or the glasses, as well as the crystal phase or phases which are deposited during devitrification, to have a coefficient of expansion which corresponds to that of the silk-screening substrate (usually aluminum oxide).

The examples of the tested glasses are summarised in the form of a table (I).

In addition to the composition, this table (I) also records the strain point (Str.p) in ° C., the dilatometric softening point (Sof.p) in ° C., the coefficient of expansion between 20° and 320° C. and the density in $kg/m^3$.

TABLE I

| | Molar Compositions | | | | | |
|---|---|---|---|---|---|---|
| | A | B | C | D | E | F |
| ZnO | 20 | 20 | 20 | 30 | 35 | 40 |
| $SiO_2$ | 40 | 40 | 15 | 15 | 10 | 20 |
| $B_2O_3$ | 15 | 15 | 35 | 30 | 35 | 15 |
| $Al_2O_3$ | 5 | 4.5 | 5 | 5 | 0 | 5 |
| CaO | 5 | 5 | 25 | 20 | 20 | 20 |
| SrO | 15 | 15 | — | — | — | — |
| CoO | — | 0.5 | — | — | — | — |
| Str.p. (° C.) | 590 | 585 | 575 | 570 | 575 | 560 |
| Sof.p. (° C) | 620 | 605 | 590 | 600 | 600 | 590 |
| $10^7 \alpha$ 20-320° C. | 61.5 | 62.8 | 65.5 | 63 | 64 | 63.5 |
| e (Kg/m3) | 3265 | 3260 | 3035 | 3230 | 3290 | 3500 |

Each of the types of glass of the above table (I) given by way of example has been processed to a dielectric composition according to the invention by mixing a certain quantity of aluminum oxide and glass. These dielectric compositions are summarized in the form of a table II.

The preferred composition is composition No. 2 which comprises a mixture of 45% aluminum oxide and 55% of the glass indication by B.

Starting from each of the said compositions, a paste was formed by dispersion of the indicated composition in an organic binder. As an organic binder is frequently used a solution of ethyl cellulose in terpineol. The organic binder in the silk-screening paste may comprise 10 to 40% by weight prior to firing. The paste is then passed through a silk-screening grid in such manner that a layer is obtained as shown for example in FIGS. 1 and 2. The firing of such a layer is carried out in a nitrogen atmosphere at a temperature of, for example, 950° C. for the preferred composition.

TABLE II

| | Volume % Compositions. | | | | | | | |
|---|---|---|---|---|---|---|---|---|
| Example No. | $Al_2O_3$ | A | B | C | D | E | F | Glass non-devitrifiable by the action of aluminium oxide |
| 1 | 40 | 60 | — | — | — | — | — | — |

TABLE II-continued

| Example No. | Al$_2$O$_3$ | A | B | C | D | E | F | Glass non-devitrifiable by the action of aluminium oxide |
|---|---|---|---|---|---|---|---|---|
| 2 | 45 | — | 55 | — | — | — | — | — |
| 3 | 50 | — | — | 40 | — | — | 10 | — |
| 4 | 60 | — | — | — | 40 | — | — | — |
| 5 | 45 | — | — | — | — | 55 | — | — |
| 6 | 30 | — | — | — | — | — | 70 | — |
| 7 | 45 | — | 50 | — | — | 5 | — | — |
| 8 | 48 | 40 | — | 7 | — | 5 | — | — |
| 9 | 45 | — | 50 | — | — | — | — | 5 |

Accurate electric measurements have been carried out on the layer obtained from the preferred composition; the results obtained are summarized below:

| Measurements | | Composition n° 2 |
|---|---|---|
| $\epsilon$ | = | 7 |
| $10^3 \times tg\delta$ | = | 3 for 1 KHz |
| " | = | 4 for 1 MHz |
| " | = | 4 for 10 MHz |
| " | = | 3 for 20 MHz |

The provided insulating layer had an area of 10 cm$^2$ and a thickness of 40 μm. With an applied voltage of 50 V the resistance of the insulating layer exceeded $10^{11}$ Ω per square.

Accurate analyses of the layer have demonstrated that the crystal phases which are formed during firing are (Ca, Sr) Al$_2$Si$_2$O$_8$ and ZnAl$_2$O$_4$; furthermore the quantity of zinc aluminate formed increases considerably as a function of the duration of the thermal treatment, while of course the quantity of aluminum oxide decreases.

The coefficients of expansion of the various parts of the circuit are:

glass $63.10^{-7}$ ° C.$^{-1}$,
aluminum oxide $68.10^{-7}$ ° C.$^{-1}$,
thick layer $62.10^{-7}$ ° C.$^{-1}$ (after firing), which are very favorable values for the rigidity of the assembly, the glass and the thick layer being under a slight pressure under the influence of the substrate of aluminium oxide.

Other electrical circuit elements of the same type have been manufactured in this manner. FIG. 3 is a plan view of a second multilayer circuit according to the invention, while FIG. 4 is a sectional view taken on the line II–II′ of FIG. 3.

Reference numerals are the same for the same elements. Reference numeral 1 denotes the substrate of aluminium oxide, reference numeral 2 is the conductive copper layer and reference numeral 3 is an insulating layer the composition of which is that of the present invention. The electric circuit element shown in FIGS. 3 and 4 which is a circuit of the type having crossings at different levels is usually referred to as "cross-over".

What is claimed is:

1. A silk-screening paste for multilayer circuit fabrication comprising: a dielectric mixture of borosilicate glass present in a quantity between 40 and 70% by volume and having a composition consisting essentially of the following ranges in mol.%:

10–40 SiO$_2$
20–40 ZnO
15–35 B$_2$O$_3$
0–5 Al$_2$O$_3$
5–25 CaO
0–15 SrO;

aluminum oxide in a quantity between 30 and 60% by volume; and a coloring oxide in a quantity smaller than 1 mol.%, said coloring oxide including cobalt oxide in a quantity of 0.5 mol.%, dispersed in an organic carrier.

2. A silk-screening paste as defined in claim 1 wherein said borosilicate glass consists essentially of in mol.%:

40 SiO
20 ZnO
15 B$_2$O$_3$
5 Al$_2$O$_3$
5 CaO
15 SrO.

* * * * *